United States Patent [19]
Fujiyama et al.

[11] Patent Number: 5,660,634
[45] Date of Patent: Aug. 26, 1997

[54] ROTARY-CUP LIQUID SUPPLY DEVICE

[75] Inventors: Shigemi Fujiyama; Kazunobu Yamaguchi; Hiroyoshi Sago, all of Kanagawa, Japan

[73] Assignee: Tokyo Ohka Kogyo Co., Ltd., Kanagawa, Japan

[21] Appl. No.: 556,176

[22] Filed: Nov. 9, 1995

[30] Foreign Application Priority Data

Nov. 18, 1994 [JP] Japan .................. 6-285677

[51] Int. Cl.$^6$ .................. B05C 5/00; B05C 13/02
[52] U.S. Cl. .................. 119/319; 118/320; 118/52; 118/500; 269/21
[58] Field of Search .................. 118/319, 320, 118/52, 500, 501; 269/21; 279/3

[56] References Cited

U.S. PATENT DOCUMENTS

| | | |
|---|---|---|
| 3,730,134 | 5/1973 | Kadi . |
| 4,640,846 | 2/1987 | Kuo . |
| 4,889,069 | 12/1989 | Kawakami . |
| 5,042,421 | 8/1991 | Anbe . |
| 5,234,499 | 8/1993 | Sasaki . |
| 5,415,691 | 5/1995 | Fujiyama et al. . |
| 5,439,519 | 8/1995 | Sago et al. .................. 118/501 |

FOREIGN PATENT DOCUMENTS

| | | |
|---|---|---|
| 2531134 | 1/1976 | Germany . |
| 6-170315 | 6/1994 | Japan . |

*Primary Examiner*—Donald E. Czaja
*Assistant Examiner*—Calvin Padgett
*Attorney, Agent, or Firm*—Weiner, Carrier & Burt, P.C.; Joseph P. Carrier; Irving M. Weiner

[57] ABSTRACT

A vacuum chuck and an inner cup are rotated together by a spinner for spreading and coating a coating solution uniformly on a glass substrate in the inner cup under centrifugal forces. Under the centrifugal forces, gases that are present inward of a rectangular ridge in the inner cup are forced to flow outwardly through a gap between the rectangular ridge and a flow-rectifying plate 42 and also through holes defined in the rectangular ridge. Therefore, turbulent flows and pressure fluctuations are minimized in a space defined inward of the rectangular ridge, i.e., a space which accommodates the glass substrate placed on a bottom surface of the inner cup inwardly of the rectangular ridge. The coating solution applied to the upper surface of the glass substrate is allowed to form a uniform film thereon.

19 Claims, 5 Drawing Sheets

5,660,634

ROTARY-CUP LIQUID SUPPLY DEVICE

BACKGROUND OF THE INVENTION

1. Field of the Invention

The present invention relates to a rotary-cup liquid supply device for supplying a solution, such as a solution of a silicon compound dissolved in an organic solvent, to form a film such as a SOG (Spin-on-Glass) coating film on a surface of a planar workpiece such as a glass substrate.

2. Description of Relevant Art

There has heretofore been known a rotary-cup liquid supply device having an outer cup, an inner cup rotatable by a spinner, the inner cup being disposed in the outer cup, and a flow-rectifying plate attached to the lower surface of a lid which closes an upper opening of the inner cup, in confronting relation to the surface of a planar workpiece set in the inner cup.

Japanese laid-open patent publication No. 6-170315 discloses an improvement in the above conventional rotary-cup liquid supply device. In the improved device, an annular spacer is mounted on an inner bottom surface of the inner cup, defining a small space between the annular spacer and the flow-rectifying plate in surrounding relation to the planar workpiece. The annular spacer has holes defined therein which serve as both air vent holes and drain holes. In operation, the inner cup is rotated with the planar workpiece set therein being surrounded by the small space, and a coating solution applied to the planar workpiece is spread over the surface thereof by centrifugal forces. Since turbulent flows and pressure fluctuations are minimized in the small space, the applied coating solution is uniformly coated on the surface of the planar workpiece. However, the annular spacer cannot easily be cleaned or otherwise serviced for maintenance because of the holes defined therein which serves as both air vent holes and drain holes.

SUMMARY OF THE INVENTION

It is an object of the present invention to provide a rotary-cup liquid supply device which can easily be cleaned or otherwise serviced for maintenance.

Another object of the present invention is to provide a rotary-cup liquid supply device in which a space for accommodating a workpiece to be coated with a coating solution can quickly be depressurized.

According to the present invention, there is provided a rotary-cup liquid supply device comprising an outer cup, an inner cup rotatably disposed in the outer cup for holding a planar workpiece in the inner cup, the inner cup having an upper opening, a lid positionable for selectively closing the upper opening of the inner cup, a nozzle for dropping a liquid onto the planar workpiece held in the inner cup before the upper opening of the inner cup is closed by the lid, a flow-rectifying plate mounted on the lid in confronting relation to the planar workpiece held in the inner cup when the upper opening of the inner cup is closed by the lid, and a ridge similar in shape to the planar workpiece and mounted on an inner bottom surface of the inner cup near an outer peripheral edge of the planar workpiece, the ridge and the flow-rectifying plate defining a gap therebetween when the upper opening of the inner cup is closed by the lid.

The ridge may be positioned below the flow-rectifying plate out of physical interference with a lower surface of the flow-rectifying plate, thereby defining the gap when the upper opening of the inner cup is closed by the lid. Alternatively, the ridge may be positioned outside of the flow-rectifying plate out of physical interference with an outer surface of the flow-rectifying plate, thereby defining the gap when the upper opening of the inner cup is closed by the lid.

The ridge has at least one hole or recess defined therein for discharging an excess of liquid from the planar workpiece therethrough.

The rotary-cup liquid supply device may further comprise a pedestal similar in shape to the planar workpiece and disposed on the inner bottom surface of the inner cup, the pedestal having a land for abutment against a lower surface of the outer peripheral edge of the planar workpiece, the ridge being mounted on the land.

The planar workpiece may have a rectangular shape, and the ridge may have communication openings defined respectively in four corners thereof. The outer cup may have a liquid retrieval passage defined therein radially outwardly of the inner cup, and the inner cup may have drain holes defined therein on imaginary lines connecting the communication openings to the center of the inner cup, the drain holes communicating with the liquid retrieval passage.

In operation, the upper opening of the inner cup is closed by the lid, whose lower surface is positioned closely to the upper surface of the planar workpiece set in the inner cup. Then, the inner cup is rotated to cause the liquid dropped on the upper surface of the planar workpiece to be spread and coated uniformly thereon under centrifugal forces. Gases present inwardly of the ridge in the inner cup are forced to flow through the gap between the ridge and the flow-rectifying plate under the centrifugal forces. Therefore, turbulent flows and pressure fluctuations are minimized in a space defined inward of the rectangular ridge, i.e., a space which accommodates the glass substrate placed on a pedestal inwardly of the rectangular ridge, and the space is quickly depressurized.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
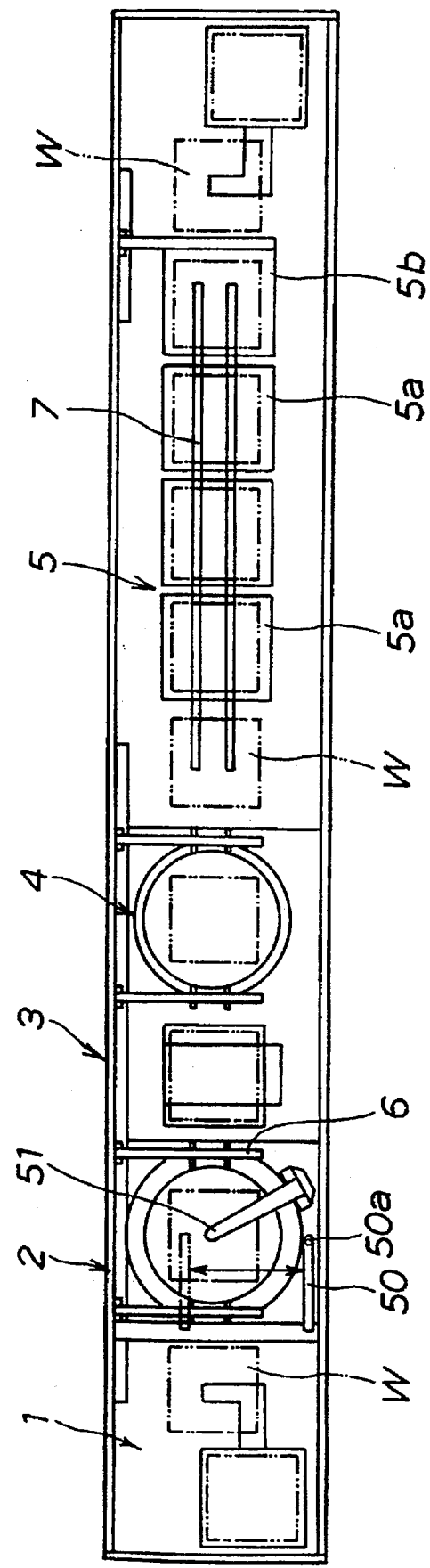
FIG. 1 is a plan view of a film coating line which includes a coating device that incorporates a rotary-cup liquid supply device according to the present invention.

As shown in FIG. 1, a film coating line which includes a coating device that incorporates a rotary-cup liquid supply device according to the present invention successively coats films such as SOG coating films on rectangular planar workpieces W such as glass substrates as they are successively fed along the film coating line from an upstream end that is shown as a left-hand end to a downstream end that is shown as a right-hand end.

The film coating line includes a workpiece charger 1 positioned at the upstream end for successively charging glass substrates W into the film coating line, a coating device 2 positioned downstream of the workpiece charger 1, a depressurizing/drying device 3 positioned downstream of the coating device 2, a cleaning device 4 for cleaning the reverse side of a glass substrate W, and a heating device 5 positioned downstream of the cleaning device 4, the heating device 5 comprising an array of hot plates 5a and a cooling plate 5b.

A glass substrate W is fed from the workpiece charger 1 to the heating device 5 by a feed mechanism 6 which supports the lower surface of the glass substrate W at its leading and trailing ends. In the coating device 2, the upper surface of the glass substrate W is coated with a desired film. In the depressurizing/drying device 3, the glass substrate W is depressurized and dried. In the cleaning device 4, the reverse side of the glass substrate W is cleaned. In the heating device 5, the glass substrate W is fed successively over the hot plates 5a and the cooling plate 5b by a feed mechanism 7 which supports the lower surface of the glass substrate W while making cranking or zigzag movement in a vertical plane. The hot plate 5a heat the glass substrate W when it moves successively over the hot plates 5a. The cooling plate 5b finally cools or, regulates the temperature, of the glass substrate W when it moved over the cooling plate 5b.

Figure 2:
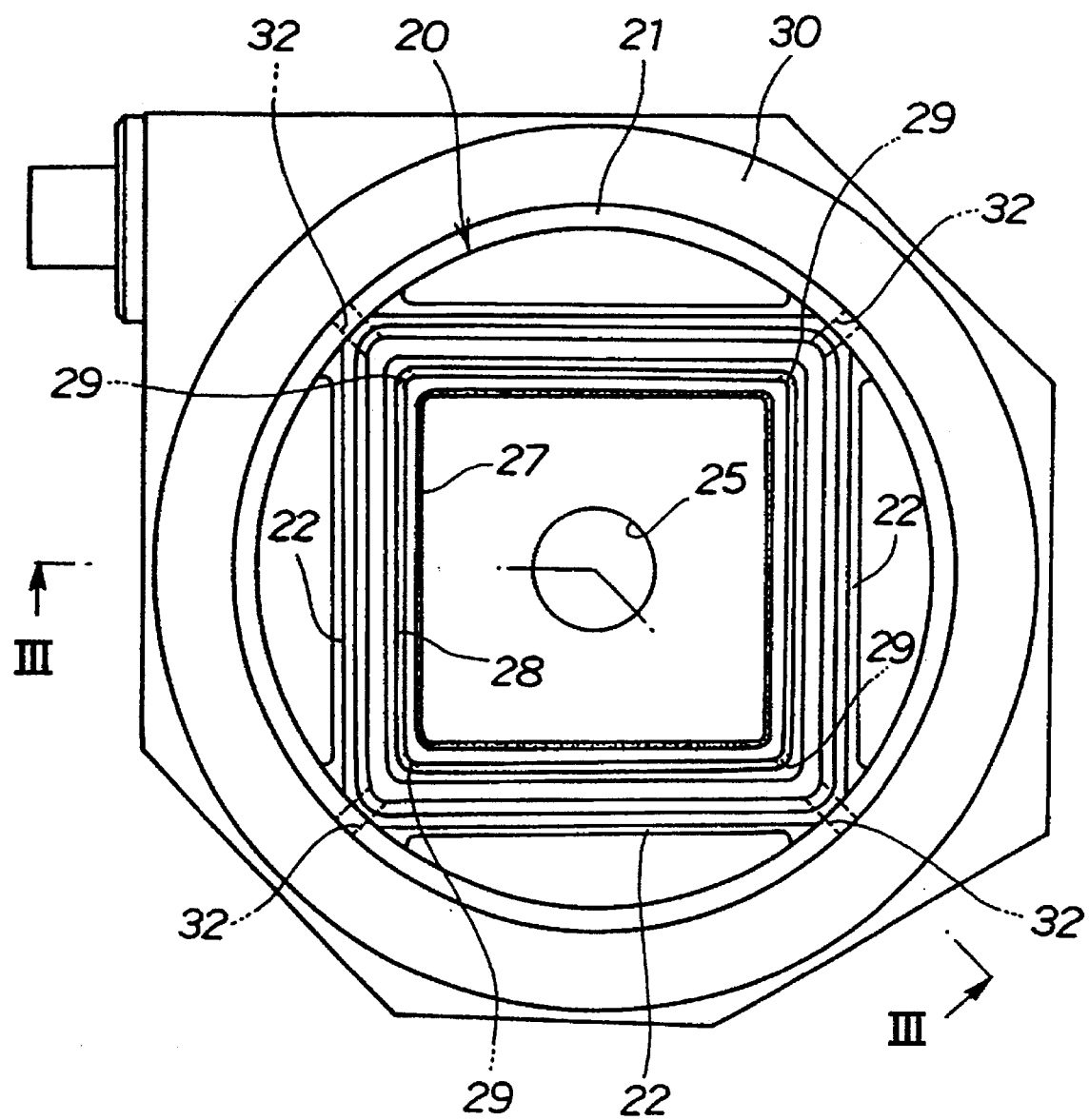
FIG. 2 is a plan view of the coating device with a lid assembly removed.
Figure 3:
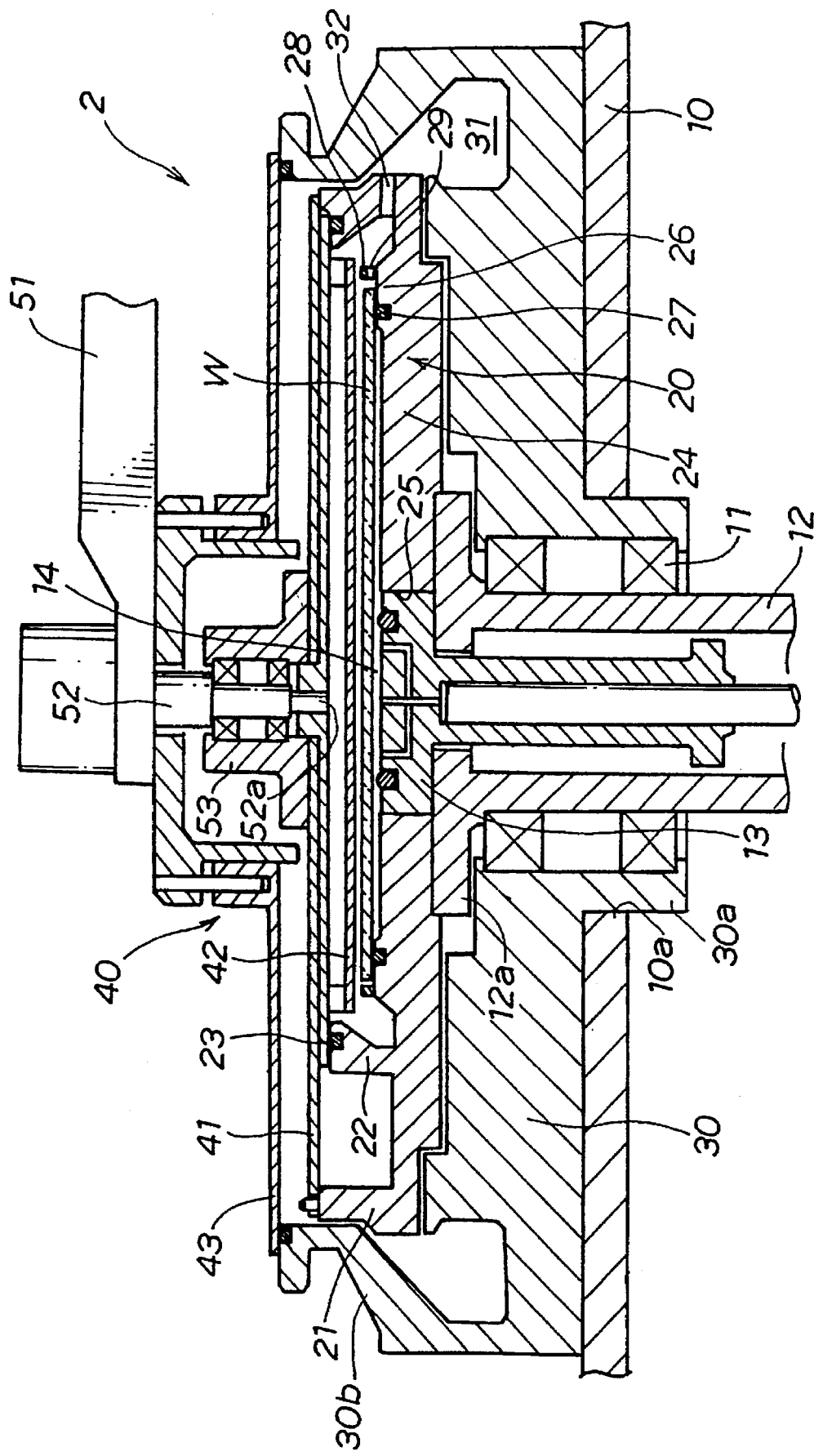
FIG. 3 is a cross-sectional view taken along line III—III of FIG. 2, with the lid assembly attached.

As shown in FIGS. 2 and 3, the coating device 2 comprises a base 10, an upwardly open inner cup 20, an upwardly open outer cup 30 mounted on the base 10 and holding the inner cup 20 therein, and a lid assembly 40 selectively supportable on the outer cup 30 and lying over the inner cup 20. The outer cup 30 has a central sleeve 30a (see FIG. 3) projecting downwardly through a central opening 10a defined in the base 10. The central sleeve 30a holds a bearing 11 therein. The coating device 2 also has a spinner which includes a hollow rotatable shaft 12 extending through and rotatably supported by the bearing 11. The hollow rotatable shaft 12 has an upper end flange 12a on which the inner cup 20 is fixedly mounted.

The inner cup 20 has an annular outer circumferential wall 21 projecting upwardly and positioned immediately radially inwardly of an annular outer circumferential wall 30b of the outer cup 30. The inner cup 20 also has a rectangular wall or a rectangular pattern of linear walls 22 positioned radially inwardly of the annular outer circumferential wall 21. The rectangular glass substrate W which is placed in the inner cup 20 has its outer peripheral edges equally spaced from the rectangular wall 22 for thereby preventing turbulent flows from being developed in the inner cup 20 while the coating apparatus 2 is in operation. A seal 23 is received in a slot which is defined in the upper surface of the rectangular wall 22.

The inner cup 20 also has a pedestal 24 on its inner bottom surface which extends in a hollow rectangular pattern that is similar in shape to the glass substrate W. The pedestal 24 has a central opening 25 defined therein and a land 26 on its upper surface along outer peripheral edges thereof for abutting against the lower surface of the outer peripheral edges of the glass substrate W. A seal 27 is received in a slot which is defined in the upper surface of the land 26 for direct abutting engagement with the lower surface of the outer peripheral edges of the glass substrate W. When the lower surface of the outer peripheral edges of the glass substrate W is placed on the land 26, the outer peripheral edges of the glass substrate W do not project outwardly beyond the pedestal 24.

A vacuum chuck 13 extends vertically through the hollow rotatable shaft 12 and has a suction pad 14 disposed in the central opening 25 of the pedestal 24. The vacuum chuck 13 is vertically movable between an elevated position in which the vacuum chuck 13 receives the glass substrate W on the suction pad 14 and transfers the glass substrate W from the suction pad 14, and a lowered position (shown in FIG. 3) in which the suction pad 14 has its upper surface lying flush with or slightly lower than the elongate land 26.

As shown in FIG. 1, arms 50, 51 are disposed above the inner cup 20 and the outer cup 30. The arms 50, 51 are movable linearly, angularly, and/or vertically out of physical interference with each other. The arm 50 supports a nozzle 50a for dropping a coating solution such as a resist solution or the like. As shown in FIG. 3, the arm 51 supports the lid assembly 41 on its distal end, to which there is attached a downwardly extending shaft 52 having a nozzle 52a for ejecting a nitrogen gas and a cleaning solution.

A boss 53 is rotatably fitted over the shaft 52 through a bearing and a magnetic seal. The lid assembly 40 includes a lower circular lid 41 of aluminum fixed to the boss 53 for selectively closing the upper opening of the inner cup 20, a flow-rectifying plate 42 attached to the lower surface of the lid 41 for preventing turbulent flows from being developed in the inner cup 20, and an upper lid 43 fixed to the lower surface of the distal end of the arm 51 above the lower lid 41 for selectively closing the upper opening of the outer cup 30.

A rectangular ridge 28 similar in shape to the peripheral edge of the glass substrate W is mounted on the land 26 closely to the outer peripheral edges of the glass substrate W. When the upper opening of the inner cup 20 is closed by the lower lid 41, there is a small gap or clearance formed between the flow-rectifying plate 42 and the rectangular ridge 28.

Figure 4:
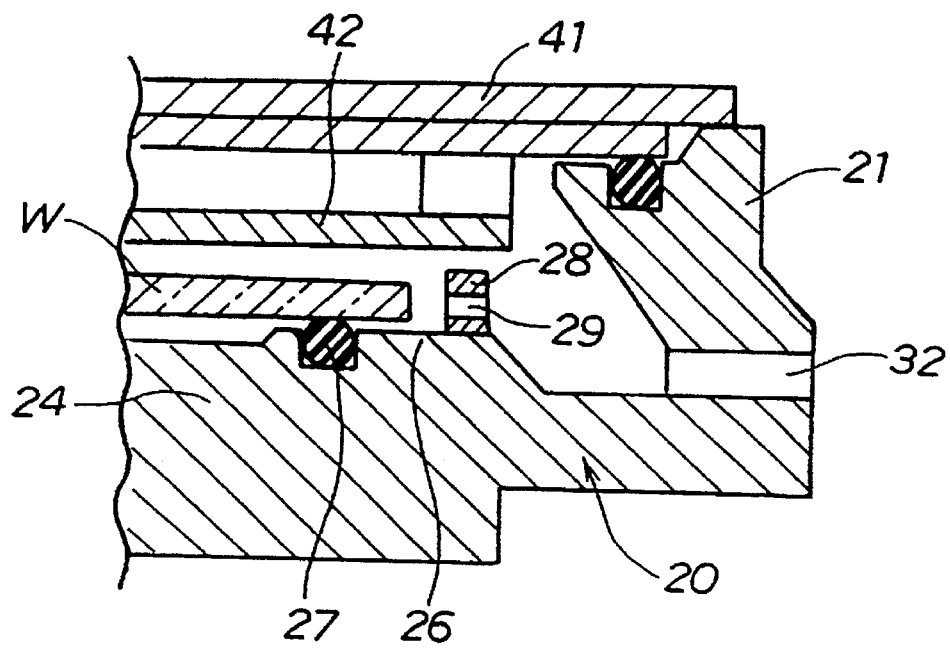
FIG. 4 is an enlarged fragmentary cross-sectional view of a portion of the coating device shown in FIG. 3.

As shown in FIG. 4, the rectangular ridge 28 is positioned below the flow-rectifying plate 42, and has such a height that an upper surface of the ridge is held out of physical interference with the lower surface of the flow-rectifying plate 42.

Figure 5:
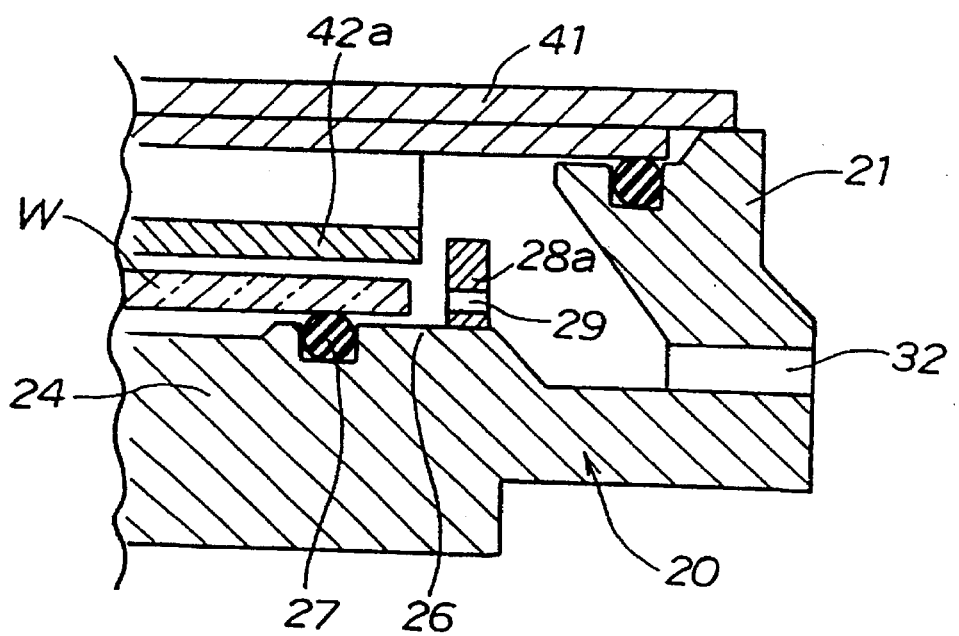
FIG. 5 is an enlarged fragmentary cross-sectional view similar to FIG. 4, but showing a modified structure.

FIG. 5 shows a modification in which a rectangular ridge 28a is positioned outside of a flow-rectifying plate 42a, such that the inner surface of the rectangular ridge 28 is held out of physical interference with the outer surface of the flow-rectifying plate 42.

Figure 6:
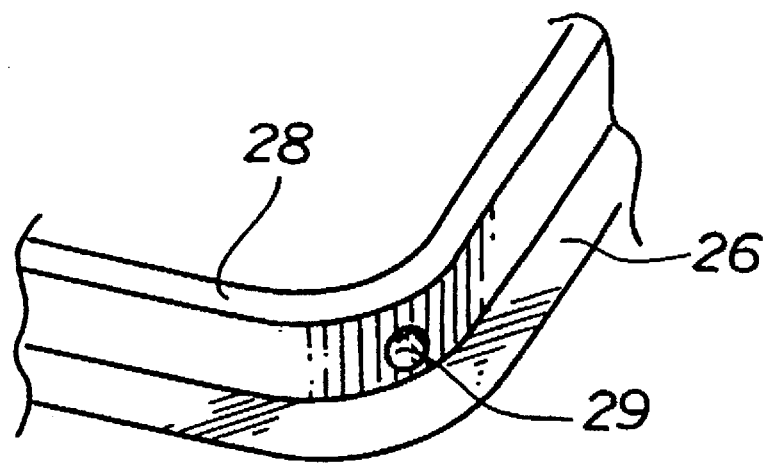
FIG. 6 is an enlarged fragmentary perspective view of a corner of a ridge.

As shown in FIGS. 3, 4, and 6, the rectangular ridge 28 which surrounds the glass substrate W placed on the pedestal 24 has circular holes 29 defined respectively in the four corners thereof. The inner cup 20 has drain holes 32 defined in the annular outer circumferential wall 21 at respective positions on imaginary lines connecting the holes 29 to a vertical axis extending through the center of the bottom surface of the inner cup 20. The drain holes 32 communicate with a solution retrieval passage 31 that is defined in the outer cup 30 immediately inwardly of the annular outer circumferential wall 30b thereof and radially outwardly of the inner cup 20.

Since the drain holes 32 are positioned on the imaginary lines connecting the holes 29 to the center of the bottom surface of the inner cup 20, an excess of coating solution that has been expelled from the glass substrate W will not remain trapped in the inner cup 20, but can effectively and quickly be discharged through the holes 29 and the drain holes 32, and retrieved in the solution retrieval passage 31.

Figure 7:
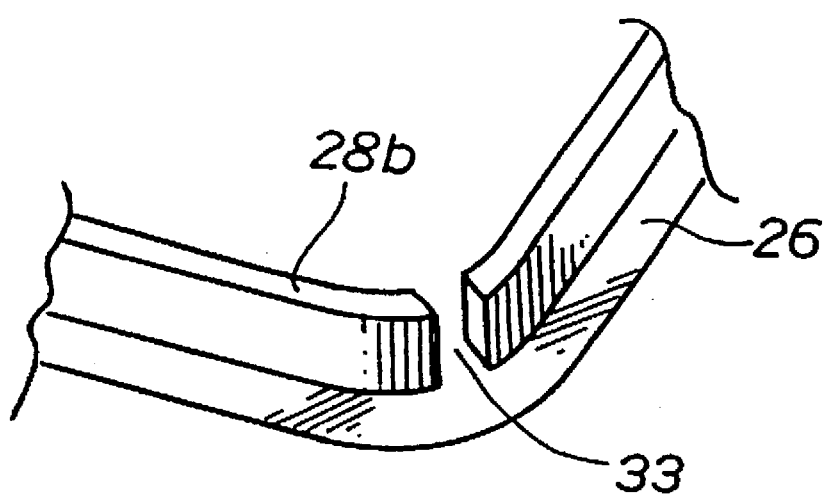
FIG. 7 is an enlarged fragmentary perspective view similar to FIG. 6, but showing a modified structure.

FIG. 7 illustrates a modification in which a rectangular ridge 28b on the pedestal 26 has recesses 33 defined respectively in the four corners thereof.

The holes 29 (see FIG. 6) in the rectangular ridge 28 or the recesses 33 (see FIG. 7) in the rectangular ridge 28b need not be positioned at the respective corners of the rectangular ridge, but may be positioned anywhere in the rectangular ridge.

The planar workpieces W to be processed by the coating device 2 are not limited to glass substrates or rectangular substrates, but may be semiconductor wafers or the like. Therefore, the ridge 28, 28a is not limited to the illustrated rectangular shape, but may be any of various other shapes.

Operation of the coating device 2 will be described below. To coat the upper surface of the glass substrate W uniformly with an SOG coating solution, the inner cup 20 and the outer cup 30 are opened upwardly, and the coating solution is dropped from the nozzle 50a on the arm 50 onto the upper surface of the glass substrate W which is firmly attracted to the suction pad 14 of the vacuum chuck 13. Thereafter, the arm 50 is retracted, and then the arm 51 is turned to a position over the inner cup 20 and the outer cup 30. The arm 51 is then lowered to cause the lower lid 41 to close the upper opening of the inner cup 20 and also to cause the upper lid 43 to close the upper opening of the outer cup 30.

Thereafter, the vacuum chuck 13 and the inner cup 20 are rotated together by the spinner for spreading and coating the coating solution uniformly on the upper surface of the glass substrate W under centrifugal forces. Under the centrifugal forces, gases that are present inward of the rectangular ridge 28 in the inner cup 20 are forced to flow outwardly through the gap between the rectangular ridge 28 and the flow-rectifying plate 42 and also through the holes 29. Therefore, turbulent flows and pressure fluctuations are minimized in a space defined inward of the rectangular ridge 28, i.e., a space which accommodates the glass substrate W placed on the pedestal 26 inwardly of the rectangular ridge 28, allowing the coating solution applied to the upper surface of the glass substrate W to form a uniform film thereon. At the same time, the space which accommodates the glass substrate W is quickly depressurized.

Inasmuch as the outer peripheral edges of the glass substrate W set on the pedestal 24 do not project outwardly beyond the pedestal 24, they will not develop undue turbulent flows in the inner cup 20.

As described above, an excess of coating solution that has been expelled from the glass substrate W under the centrifugal forces is discharged through the holes 29 and the drain holes 32, and retrieved in the solution retrieval passage 31.

The ridge 28, 28a can easily be cleaned or serviced for maintenance.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A rotary-cup liquid supply device comprising:
   an outer cup;
   an inner cup rotatably disposed in said outer cup for holding a planar workpiece in the inner cup, said inner cup having an upper opening;
   a lid positioned for selectively closing the upper opening of said inner cup;
   a nozzle for dropping a liquid onto the planar workpiece held in said inner cup before the upper opening of said inner cup is closed by said lid;
   a flow-rectifying plate mounted on said lid in confronting relation to the planar workpiece held in said inner cup when the upper opening of said inner cup is closed by said lid; and
   a ridge similar in shape to the planar workpiece and mounted on an inner bottom surface of said inner cup near and spaced radially outwardly of an outer peripheral edge of the planar workpiece, said ridge and said flow-rectifying plate defining a gap therebetween when the upper opening of said inner cup is closed by said lid.

2. A rotary-cup liquid supply device according to claim 1, wherein said ridge is positioned below said flow-rectifying plate out of physical interference with a lower surface of the flow-rectifying plate, thereby defining said gap when the upper opening of said inner cup is closed by said lid.

3. A rotary-cup liquid supply device according to claim 1, wherein said ridge is positioned outside of said flow-rectifying plate out of physical interference with an outer surface of the flow-rectifying plate, thereby defining said gap when the upper opening of said inner cup is closed by said lid.

4. A rotary-cup liquid supply device according to claim 1, wherein said ridge has at least one hole defined therein for discharging an excess of liquid from the planar workpiece therethrough.

5. A rotary-cup liquid supply device according to claim 1, wherein said ridge has at least one recess defined therein for discharging an excess of liquid from the planar workpiece therethrough.

6. A rotary-cup liquid supply device according to claim 1, further comprising:
   a pedestal similar in shape to the planar workpiece and disposed on the inner bottom surface of said inner cup, said pedestal having a projecting land portion for abutment against a lower surface of the outer peripheral edge of the planar workpiece, said ridge being mounted on said land portion.

7. A rotary-cup liquid supply device according to claim 1, wherein said planar workpiece has a rectangular shape, said ridge has communication openings defined respectively in four corners thereof, and wherein said outer cup has a liquid retrieval passage defined therein radially outwardly of said inner cup, and said inner cup has drain holes defined therein on imaginary lines connecting said communication openings to a center of said inner cup, said drain holes communicating with said liquid retrieval passage.

8. A rotary-cup liquid supply device according to claim 1, wherein said ridge is disposed radially outwardly of said outer peripheral edge of the planar workpiece in a uniformly spaced manner.

9. A rotary-cup liquid supply device according to claim 1, wherein said ridge is disposed out of contact with the planar workpiece held in the inner cup.

10. A rotary-cup liquid supply device according to claim 1, wherein said gap is defined between opposing surfaces of the ridge and the flow-rectifying plate while the planar workpiece is held within the inner cup.

11. An apparatus for coating a solution onto a workpiece comprising:

an outer cup;

an inner cup rotatively disposed in said outer cup for holding a planar workpiece in the inner cup, said inner cup having an upper opening;

means for supplying a solution onto the workpiece;

lid means for selectively closing the upper opening of the inner cup;

a flow-rectifying plate mounted on said lid means in confronting relation to the planar workpiece held in said inner cup when the upper opening of the inner cup is closed by said lid means; and a ridge similar in shape to the planar workpiece and mounted on an inner bottom surface of said inner cup and spaced radially outwardly of an outer peripheral edge of the planar workpiece, said ridge and said flow-rectifying plate defining a gap therebetween when the upper opening of the inner cup is closed by said means.

12. A solution coating apparatus according to claim 11, wherein said ridge is similar in shape to the outer peripheral edge of the planar workpiece, and is disposed radially outwardly of the outer peripheral edge of the planar workpiece in a uniformly spaced manner.

13. A solution coating apparatus according to claim 11, wherein said ridge has at least one opening defined therein for discharging an excess of liquid ejected from the planar work piece therethrough.

14. A solution coating apparatus according to claim 11, wherein said gap is defined between said ridge and at least one of a lower surface and a radially outer surface of the flow-rectifying plate.

15. A solution coating apparatus according to claim 11, wherein said inner cup further has a pedestal on the inner bottom surface thereof, said ridge being mounted on said pedestal.

16. A solution coating apparatus according to claim 11, wherein said inner cup further includes a pedestal similar in shape to the planar workpiece and disposed on the inner bottom surface of said inner cup, said pedestal having a projecting land portion for abutment against a lower surface of the outer peripheral edge of the planar workpiece, said ridge being mounted on said land portion.

17. A solution coating apparatus according to claim 11, wherein the planar work piece and said ridge are substantially rectangular in shape.

18. A solution coating apparatus according to claim 11, wherein said ridge is disposed out of contact with the planar workpiece held in the inner cup.

19. A solution coating apparatus according to claim 11, wherein said gap is defined between opposing surfaces of the ridge and the flow-rectifying plate while the planar workpiece is held within the inner cup.

* * * * *